United States Patent
Kim et al.

(10) Patent No.: US 8,034,206 B2
(45) Date of Patent: Oct. 11, 2011

(54) METHOD OF FABRICATING FLEXIBLE DISPLAY DEVICE

(75) Inventors: Myung-Hwan Kim, Yongin-si (KR); Nam-Seok Roh, Seongnam-si (KR); Sang-Il Kim, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 497 days.

(21) Appl. No.: 12/207,327

(22) Filed: Sep. 9, 2008

(65) Prior Publication Data

US 2009/0266471 A1    Oct. 29, 2009

(30) Foreign Application Priority Data

Apr. 29, 2008    (KR) ........................ 10-2008-0040006

(51) Int. Cl.
*B44C 1/17*    (2006.01)
*B29C 65/16*    (2006.01)
*B29C 65/54*    (2006.01)
*B32B 37/00*    (2006.01)
*B32B 38/10*    (2006.01)

(52) U.S. Cl. ...... 156/235; 156/239; 156/247; 156/272.8; 156/289; 430/256; 430/259; 438/455

(58) Field of Classification Search ................... 156/230, 156/235, 239, 241, 247, 272.2, 272.8, 273.5, 156/289, 308.2; 430/11, 14, 18, 201, 256, 430/259; 438/48–98, 128, 381, 455

See application file for complete search history.

(56) References Cited

U.S. PATENT DOCUMENTS

| | | | |
|---|---|---|---|
| 6,521,511 B1 * | 2/2003 | Inoue et al. | 438/458 |
| 2005/0106839 A1 * | 5/2005 | Shimoda et al. | 438/458 |
| 2006/0159867 A1 * | 7/2006 | O'Donnell | 428/1.5 |

FOREIGN PATENT DOCUMENTS

| | | |
|---|---|---|
| JP | 2004-111905 | 4/2004 |
| JP | 2005-136214 | 5/2005 |
| JP | 2006-338035 | 12/2006 |
| KR | 1020030009824 A | 2/2003 |
| KR | 1020050116844 A | 12/2005 |
| KR | 1020060061305 A | 6/2006 |

* cited by examiner

*Primary Examiner* — Philip Tucker
*Assistant Examiner* — Sing Chan
(74) *Attorney, Agent, or Firm* — Innovation Counsel LLP

(57) ABSTRACT

A method of fabricating a flexible display device, the method including applying a transparent adhesive layer on a carrier substrate, laminating a flexible substrate comprising a barrier layer on the transparent adhesive layer, forming a thin film transistor array on the flexible substrate, and separating the carrier substrate from the flexible substrate by irradiating a laser beam onto the barrier layer.

20 Claims, 10 Drawing Sheets

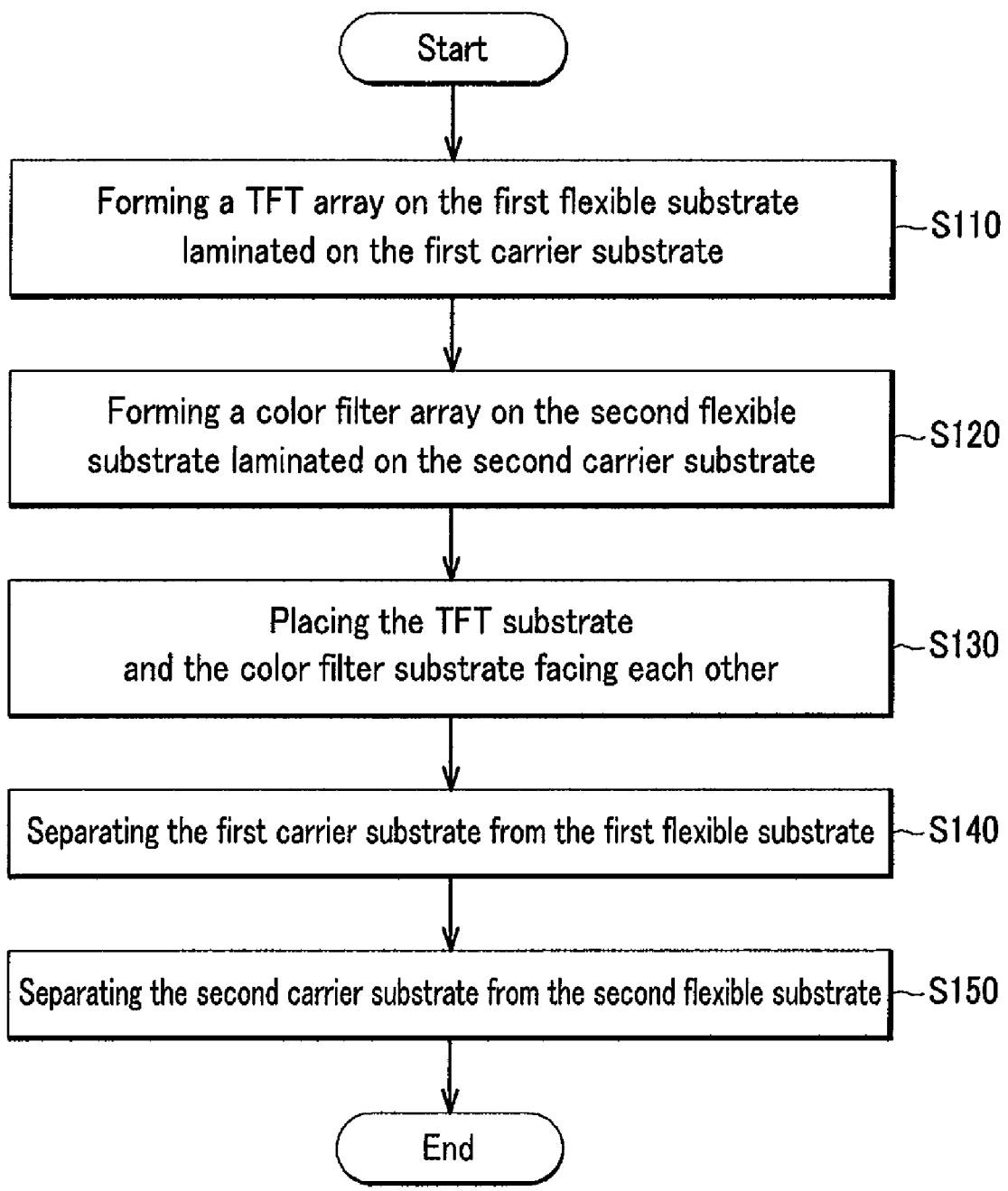

METHOD OF FABRICATING FLEXIBLE DISPLAY DEVICE

CROSS-REFERENCE TO RELATED APPLICATION

This application claims priority under 35 U.S.C. §119 to Korean Patent Application No. 10-2008-0040006, filed on Apr. 29, 2008, in the Korean Intellectual Property Office (KIPO), the contents of which are incorporated herein by reference in their entirety.

BACKGROUND OF THE INVENTION

1. Field of the Invention

The disclosure relates to display devices, and more particularly, to a method of fabricating a flexible display device.

2. Description of the Related Art

Display devices have recently included flat panel display devices capable of achieving a large display area, lightness and slimness. Flat panel display devices include liquid crystal displays ("LCDs"), plasma display panels ("PDPs"), organic light emitting displays ("OLEDs"), and the like. Conventional LCDs, PDPs, and OLEDs use a glass substrate that can be overly brittle and prone to cracking.

Recently, flexible display devices using a flexible substrate such as plastic or foil instead of a glass substrate have actively been developed as future display devices. The process of fabricating a display panel with these flexible substrates typically involves fabricating a thin film transistor ("TFT") layer on a plastic substrate ("TOP"). However, fabricating a display panel by directly forming a TFT on the plastic substrate instead of the glass substrate in an existing panel fabrication process still has difficulties in terms of processing due to the flexibility of the plastic substrate.

Accordingly, an approach for using the existing panel fabrication process with existing equipment includes applying a plastic substrate on a carrier substrate such as a glass substrate by using an adhesive layer and a separation layer, directly fabricating a TFT array on the plastic substrate, and detaching the carrier substrate from the plastic substrate.

However, an additional process is needed for forming the separation layer on the carrier substrate, thereby adding process time and expense.

SUMMARY OF THE INVENTION

An aspect of the invention provides a fabricating method of a flexible display device that can separate a carrier substrate from a plastic substrate without a process for forming a separation layer between the plastic substrate and the carrier substrate. This is accomplished by using a barrier layer previously formed on the plastic substrate instead of the separation layer.

According to an aspect of the invention, there is provided a method of fabricating a flexible display device including applying a transparent adhesive layer on a carrier substrate, laminating a flexible substrate comprising a barrier layer on the transparent adhesive layer, forming a thin film transistor array on the flexible substrate and separating the carrier substrate from the flexible substrate by irradiating a laser beam onto the barrier layer.

According to another aspect of the invention there is provided a method of fabricating a flexible display device, comprising applying a first transparent adhesive layer on a first carrier substrate, laminating a first flexible substrate comprising a first barrier layer on the first transparent adhesive layer, and forming a thin film transistor array on the first flexible substrate. The method also comprises applying a second transparent adhesive layer on a second carrier substrate, laminating a second flexible substrate comprising a second barrier layer on the second transparent adhesive layer, and forming a color filter array on the second flexible substrate. The first flexible substrate and the second flexible substrate are placed facing each other. The method then comprises separating the first carrier substrate from the first flexible substrate by irradiating a laser beam onto the first barrier layer, and separating the second carrier substrate from the second flexible substrate by irradiating a laser beam onto the second barrier layer.

BRIEF DESCRIPTION OF THE DRAWINGS

The above and other features and advantages of the invention will be more clearly understood from the following detailed description taken in conjunction with the accompanying drawings, in which:

FIG. 3 is a flow chart showing a process of fabricating a flexible display device in accordance with another embodiment of the present invention.

DETAILED DESCRIPTION OF THE EXEMPLARY EMBODIMENTS

Hereinafter, exemplary embodiments are described in detail with reference to FIGS. 1 to 4F.

Figure 1:
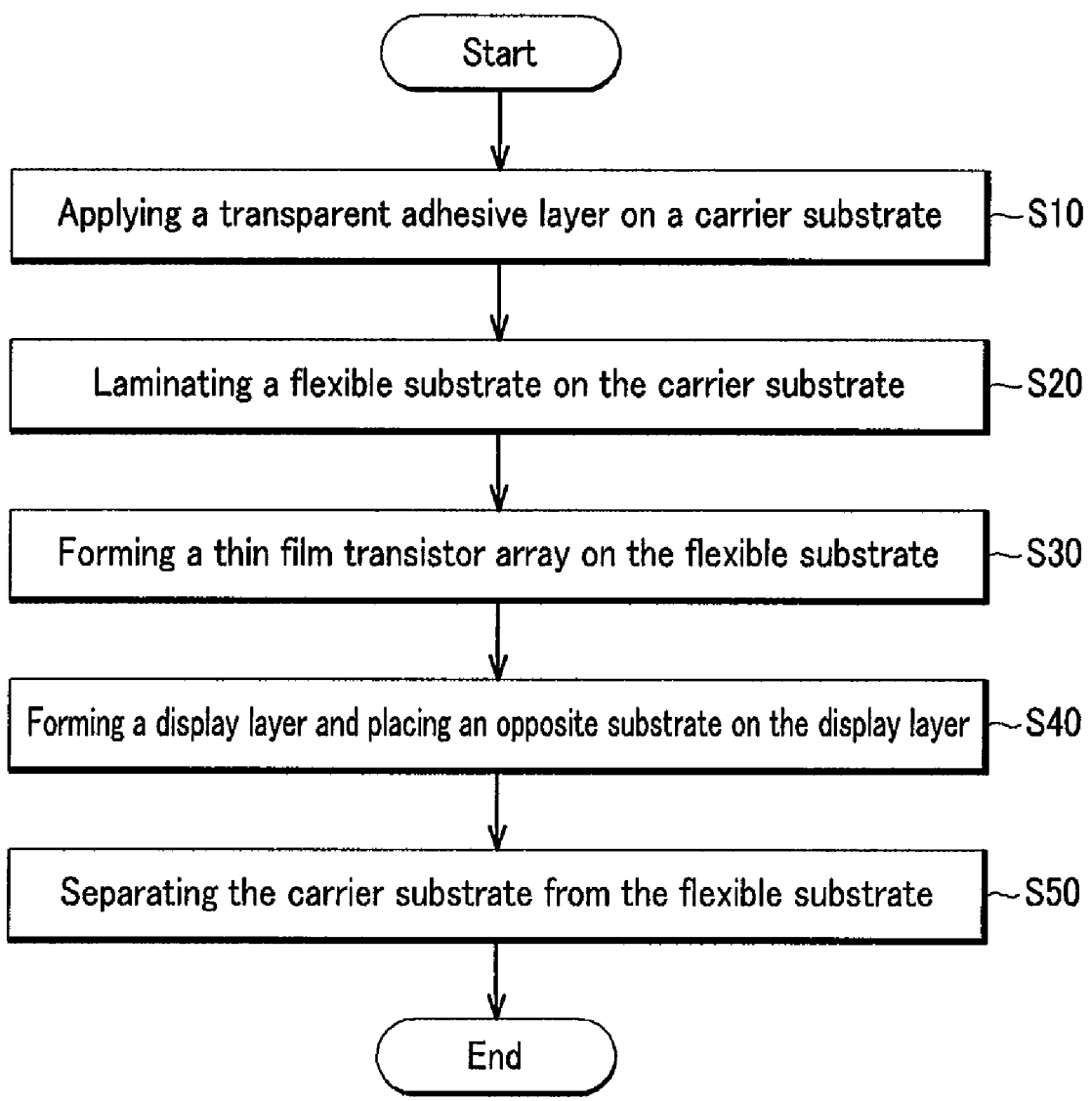
FIG. 1 is a flow chart showing a process of fabricating a flexible display device in accordance with an embodiment of the present invention.

FIG. 1 is a flow chart showing a process of fabricating a flexible display device in accordance with an embodiment of the present invention. FIGS. 2A-2F are cross-sectional views further illustrating the process of FIG. 1.

Referring to FIG. 1, a fabricating method of a flexible display device includes applying a transparent adhesive layer on a carrier substrate (step S10), laminating a flexible substrate on the carrier substrate (step S20), forming a thin film transistor ("TFT") array on the flexible substrate (step S30), forming a display layer and placing an opposite substrate on the display layer (step S40), and separating the carrier substrate from the flexible substrate (step S50). This method is described below in further detail with reference to FIGS. 2A to 2F.

Figure 2A:
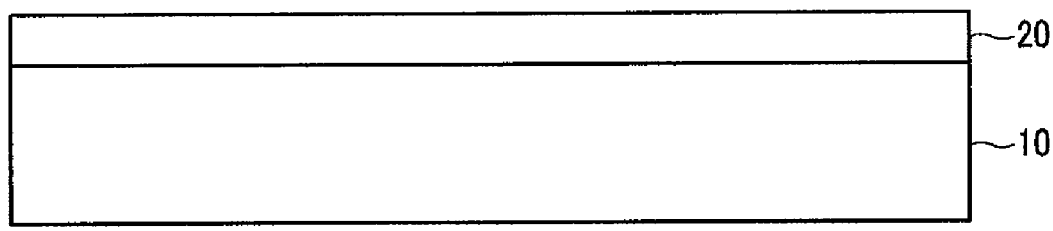
FIGS. 2A-2F are cross-sectional views showing a process of fabricating a flexible display device in accordance with an embodiment of the present invention.

Referring to FIG. 2A, a transparent adhesive layer 20 is formed on a carrier substrate 10. The carrier substrate 10 may be formed of an insulating material such as glass. The transparent adhesive layer 20 may have a transmittance passing through a laser beam of a specific wavelength and may have a glass transition temperature greater than 220° C.

The transparent adhesive layer 20 may comprise a polymer adhesive including a series of silicone or acryl. More specially, the transparent adhesive layer 20 may comprise polysilicone including polydimethylsiloxane ("PDMS") or a mixture of PDMS and silica nanopowder. For example, 290ULTRACLEAN™, a product provided by 3M™, can be used as polysilicone for an adhesive layer. The adhesive layer 20 may be applied to the carrier substrate 10 by a printing method, a slit coating method, a spin coating method, a dipping method, or the like.

Figure 2B:
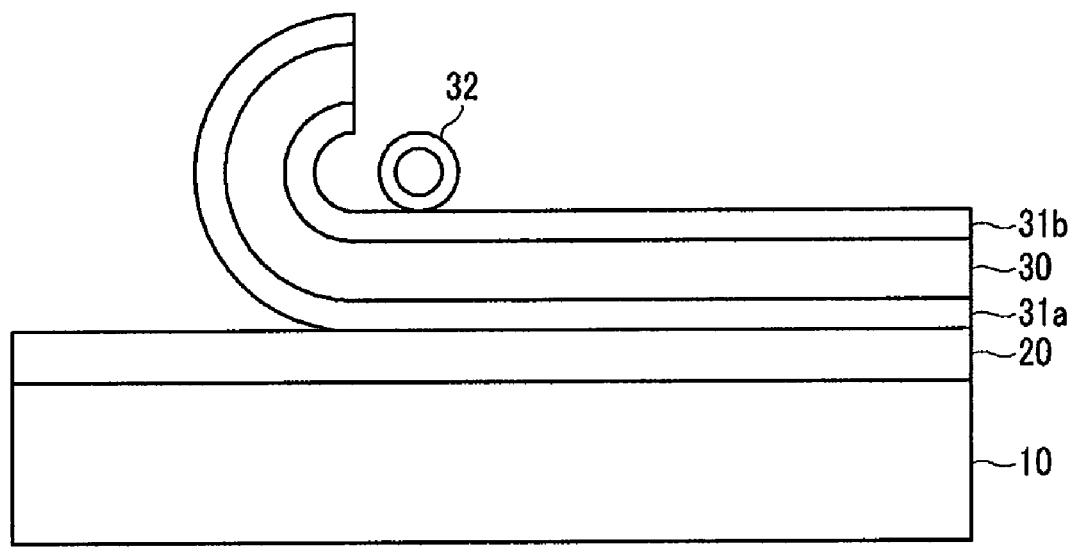

Referring to FIG. 2B, a flexible substrate 30 including a first and second barrier layer 31a and 31b is applied to the transparent adhesive layer 20. The flexible substrate 30 may be applied by a lamination method using a roller 32. The flexible substrate 30 is formed of a polymer material preferably including at least one of Kapton™ (which is a polyimide film), polyether sulphone ("PES"), polyethylene naphthalate ("PEN"), polycarbonate ("PC"), polyimide ("PI"), polyethylene terephthalate ("PET"), fiber reinforced plastic ("FRP"), or polyacrylate ("PAR").

The first and second barrier layer 31a and 31b are formed on the upper and lower faces of the flexible substrate 30, respectively, in order to prevent gas or moisture from infiltrating and diffusing into the flexible substrate 30. Alternatively, only one of the first and second barrier layers 31a and 31b may be formed on one of the upper or lower surfaces of the flexible substrate 30—namely, the surface that is irradiated by a laser beam. For example in one embodiment of the invention, if the lower surface of substrate 30 is to be irradiated by laser beam, then only one barrier layer 31a may be formed on the lower surface of the flexible substrate 30.

The first and second barrier layers 31a and 31b may be formed by depositing hydrogenated silicon nitride ("SiNx:H") or hydrogenated amorphous silicon ("a-Si:H") on the flexible substrate 30. Also, the first and second barrier layers 31a and 31b may be formed on the flexible substrate 30 by coating photolysis high molecule material including organic photo resist, urethane based resin, epoxy based resin or acryl based resin.

Figure 2C:
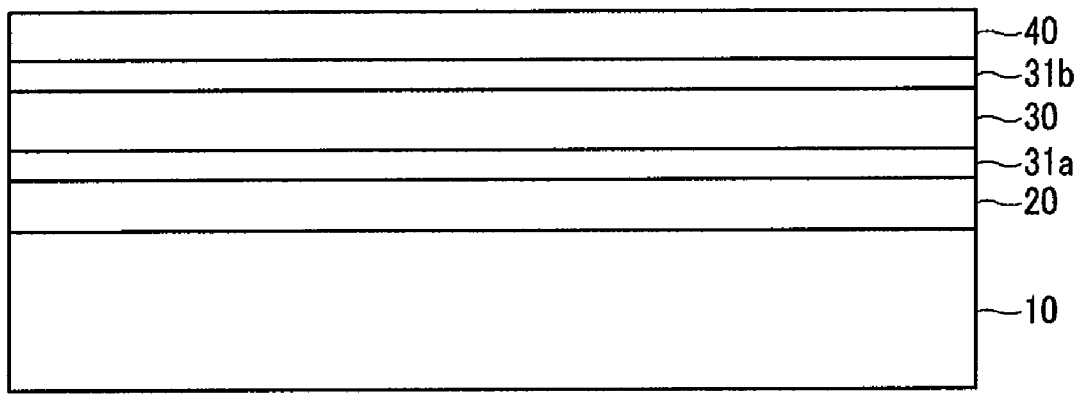

Referring to FIG. 2C, a TFT array 40 is formed on the flexible substrate 30 by well-known processes. The TFT array includes gate lines (not shown), data lines (not shown), TFTs (not shown) connected the gate lines and the data lines, and first electrodes (not shown) connected to the TFTs.

Each TFT supplies a data voltage supplied from the data line to a first electrode in response to a scan signal supplied from the gate line. Each TFT includes a gate electrode (not shown), a source electrode (not shown), a drain electrode (not shown), an active layer (not shown), and an ohmic contacting layer (not shown).

Figure 2D:
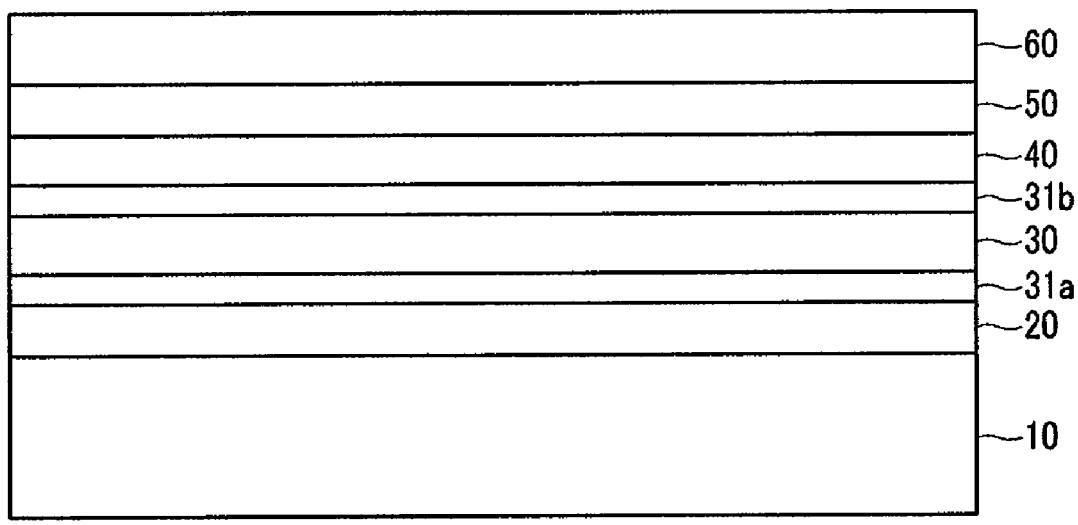

Referring to FIG. 2D, the display layer 50 and the opposite layer 60 are placed on the flexible substrate 30.

The display layer 50 may include at least one of a liquid crystal layer, an electrophoretic film, or a light emitting layer.

The opposite substrate 60 includes second electrodes, and is formed of a transparent material such as plastic or glass.

The second electrode is formed on the opposite substrate 60 to face the first electrode. The second electrode is formed of a transparent material like the opposite substrate 60. For example, the second electrode may be formed of indium tin oxide ("ITO"), indium zinc oxide ("IZO") or carbon nanotube ("CNT"). The second electrode forms the electric field together with the first electrode to control the display layer 40.

The opposite substrate 60 may further include a barrier layer (not shown).

Each first electrode generates a potential difference with a second electrode formed in an opposite substrate (60, refer to FIGS. 2D-2F) by charging a voltage according to the data voltage supplied from the corresponding TFT. A display layer (50, refer to FIG. 2D to FIG. 2F) between the flexible substrate 30 and the opposite substrate 60 is driven by the potential difference to display an image.

Figure 2E:
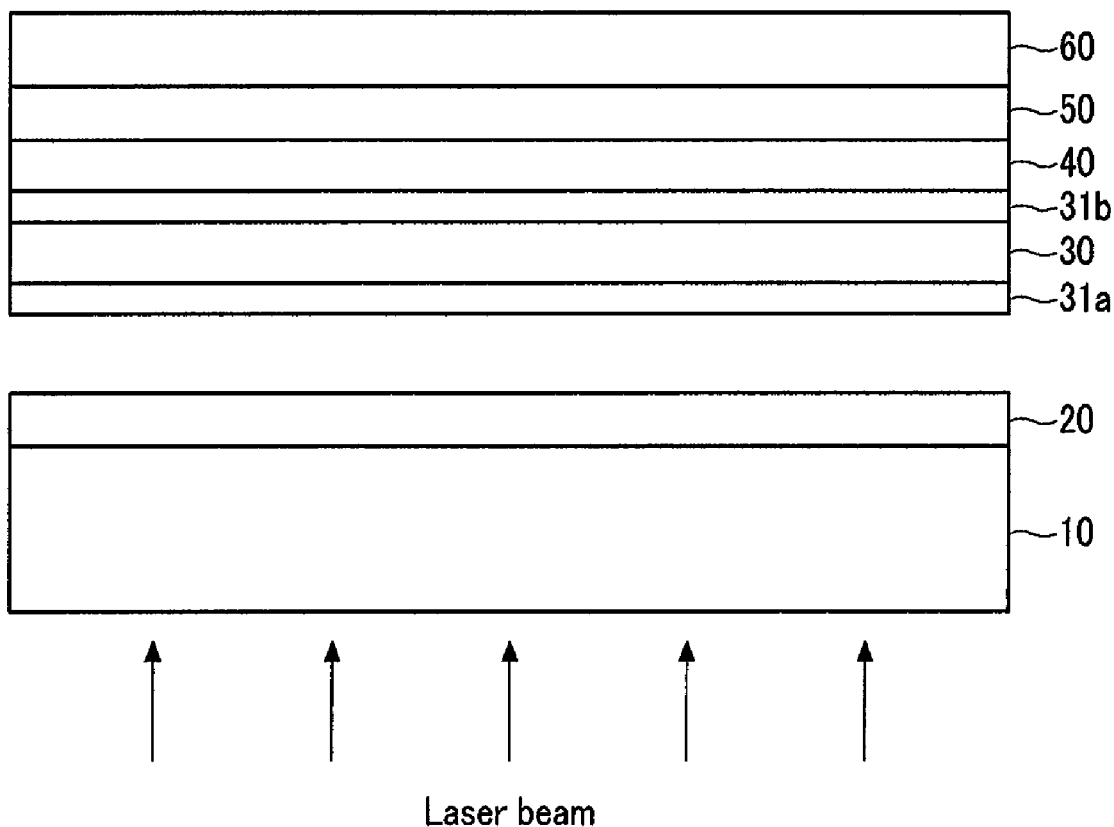
Figure 2F:
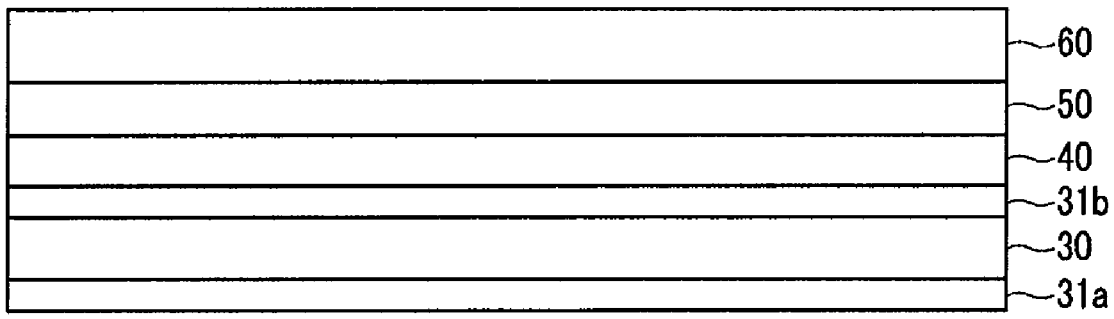

Referring to FIG. 2E and FIG. 2F, a flexible display device may be formed by irradiating a laser beam on a lower side of the carrier substrate 10. For example the laser beam may be an excimer laser beam of approximately 308 nm wavelength. When focused onto the barrier layer, the laser beam carbonizes or decomposes a covalent bond of photolysis high molecule material in the barrier layer. The laser beam also releases a hydrogen molecule from SiNx:H or a-Si:H in the first barrier layer 31a. In this manner, the surface of the first barrier layer 31a is decomposed by the irradiation of the laser beam, while at the same time, the carrier substrate 10 and the adhesive layer 20 are separated from the flexible substrate 30. The laser beam may focus on the surface of the first barrier layer 31A by controlling the intensity of the laser beam and the depth of focus ("DOF") using optical instruments. Therefore, the laser beam need not pass through the flexible substrate 30 and the second barrier layer 31b. The second barrier layer 31b may thus be omitted.

FIG. 3 is a flow chart showing a process of fabricating a flexible display device in accordance with another embodiment of the present invention. FIGS. 4A-4F are cross-sectional views further illustrating the process of FIG. 3.

Referring to FIG. 3, a fabricating method of a flexible display device in accordance with another embodiment of the present invention includes laminating a first flexible substrate including a first barrier layer on a first carrier substrate, and forming a TFT array on the first flexible substrate (step S110), forming a color filter substrate on a second carrier substrate, which includes applying an adhesive layer on the second carrier substrate, laminating a second flexible substrate including a second barrier layer on the adhesive layer, and forming a color filter array on the second flexible substrate (step S120), placing the TFT substrate and the color filter substrate facing each other (step S130), separating the first carrier substrate from the first flexible substrate (step S140) and separating the second carrier substrate from the second flexible substrate (step S150).

Figure 4A:
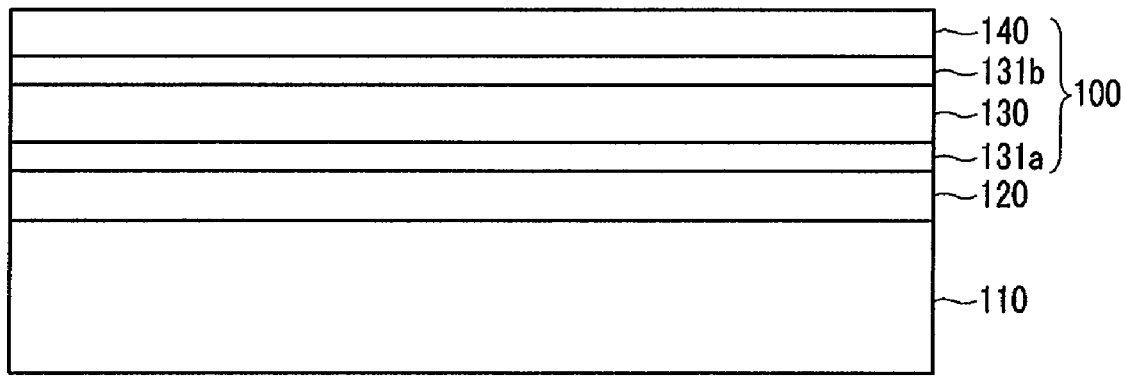
FIGS. 4A-4F are cross-sectional views showing a process of fabricating a flexible display device in accordance with another embodiment of the present invention.

Referring to FIG. 4A, a TFT substrate 100, including a TFT array 140, a first flexible substrate 130, and barrier layers 131a and 131b, is provided on a first carrier substrate 110. The TFT substrate 100 may be produced by applying a first transparent adhesive layer 120 on the first carrier substrate 110, laminating the first flexible substrate 130 including the barrier layer 131a and 131b on the transparent adhesive layer 120, and forming a TFT array 140 on the first flexible substrate 130. The above processes can be carried out in the same manner as the fabrication methods described above in connection with FIG. 2A to FIG. 2C. Therefore, redundant description of these processes is omitted.

Figure 4B:
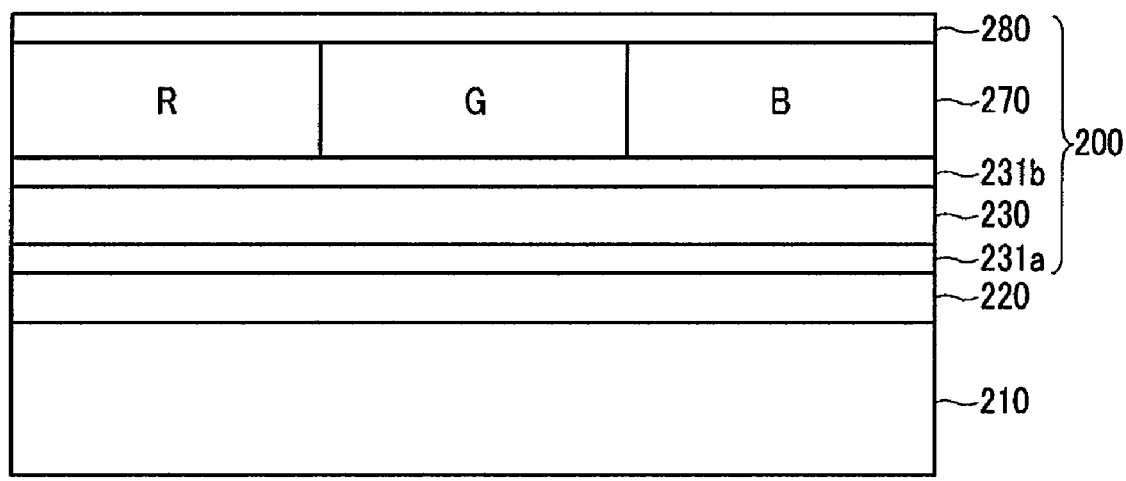

Referring to FIG. 4B, a color filter substrate 200, including a color filter array 270, a common electrode 280, a second flexible substrate 130 and barrier layers 231a and 231b, is provided on a second carrier substrate 210. The color filter substrate 200 may be produced by applying a second transparent adhesive layer 220 on the second carrier substrate 210, laminating the second flexible substrate 230 (including barrier layers 231a and 231b) on the transparent adhesive layer 220, forming a color filter array 270 (including red ("R"), green ("G"), and blue ("B") color filters) on the first flexible substrate 130, and forming the common electrode 280 on the color filter array 270. The above processes can be the same as the fabricating method of FIG. 4A except that the color filter array 270 and the common electrode 280 are formed on the flexible substrate 230 instead of the TFT array. Therefore, any repetitive description is omitted.

Figure 4C:
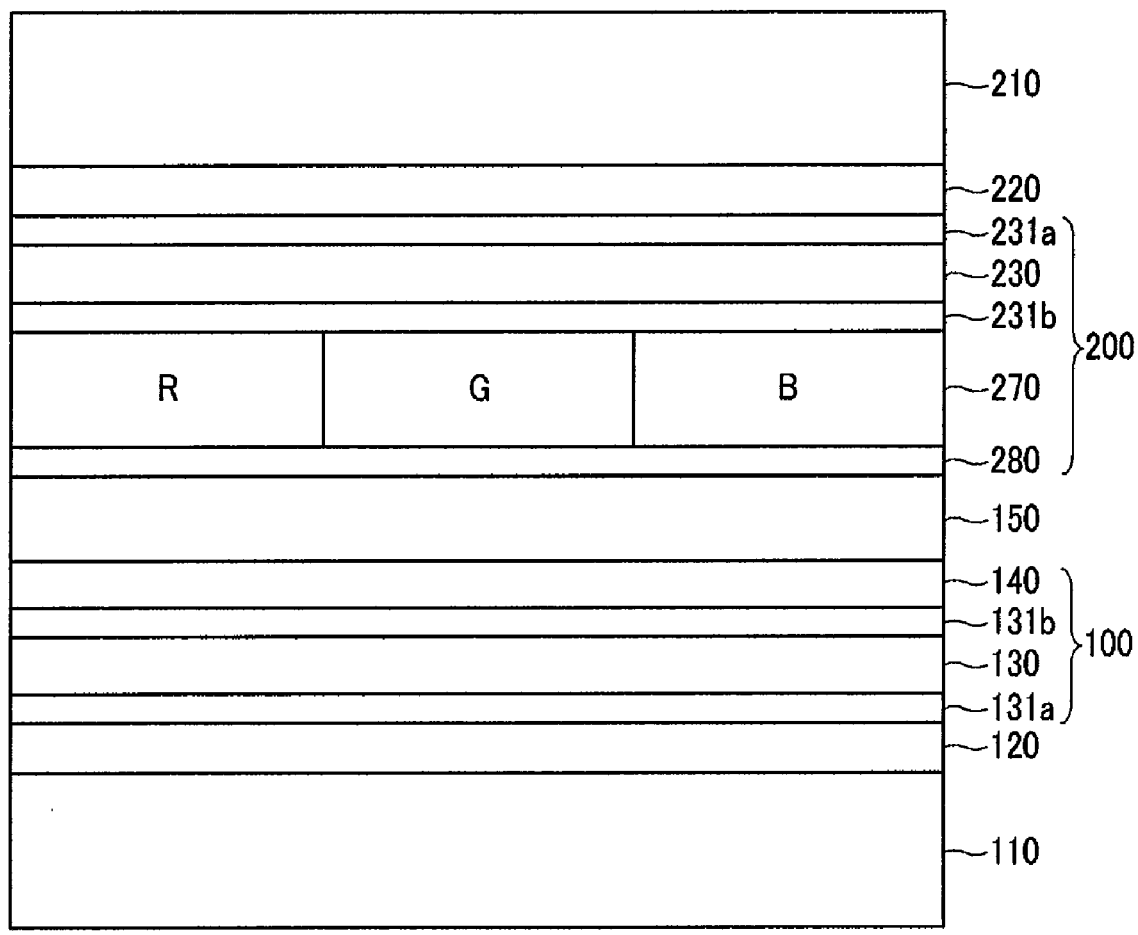

Referring to FIG. 4C, the color filter substrate 200 is placed facing the TFT substrate 100. A display layer 150 is formed between the TFT substrate 100 and the color filter array substrate 200. The display layer 150 may include at least one of a liquid crystal layer, an electrophoretic film, or a light emit layer.

Figure 4D:
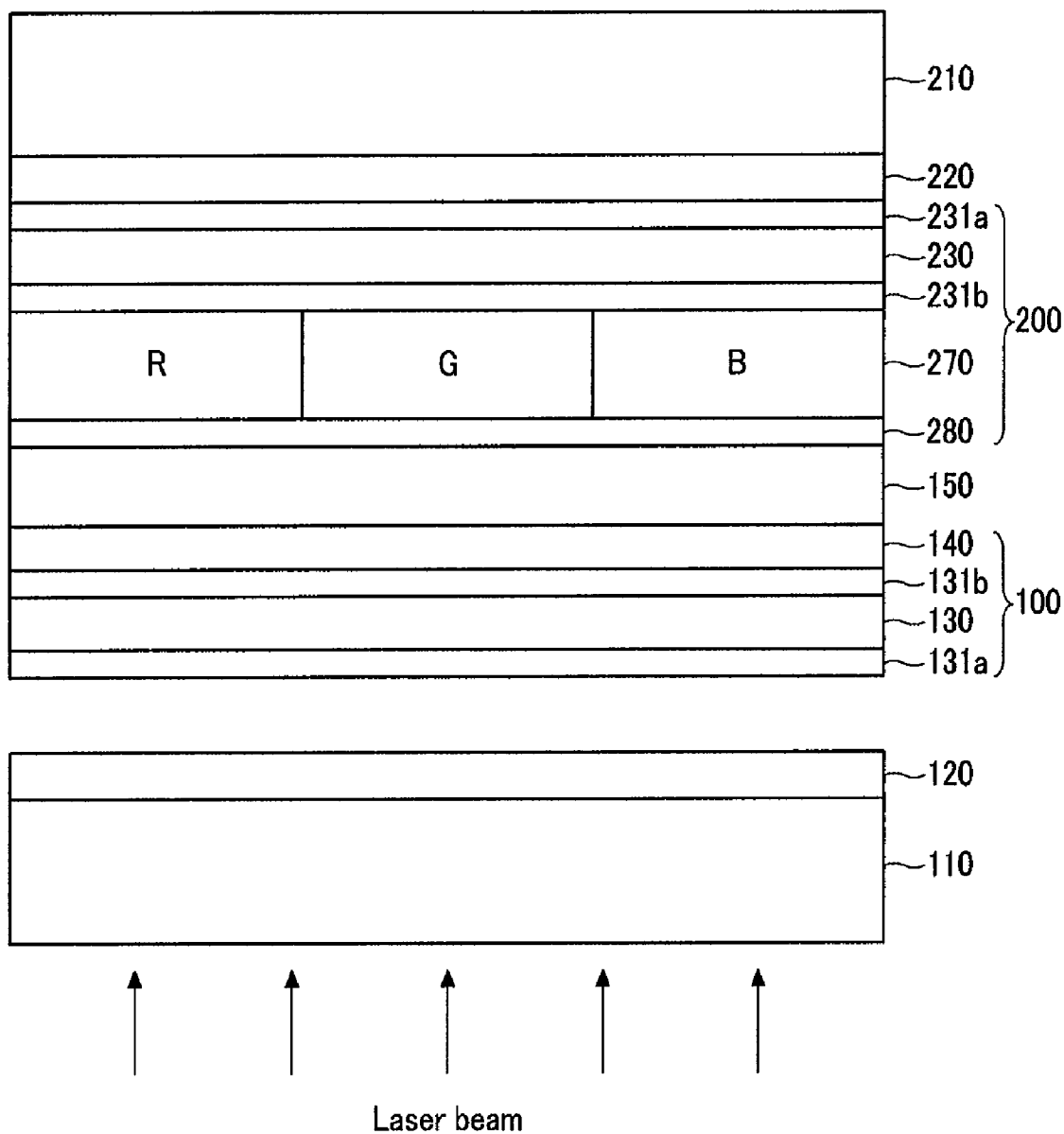

Referring to FIG. 4D, the first carrier substrate 110 and the first transparent adhesive layer 120 is separated from the TFT substrate 100 by focusing and irradiating a laser beam onto barrier layer 131a.

Figure 4E:
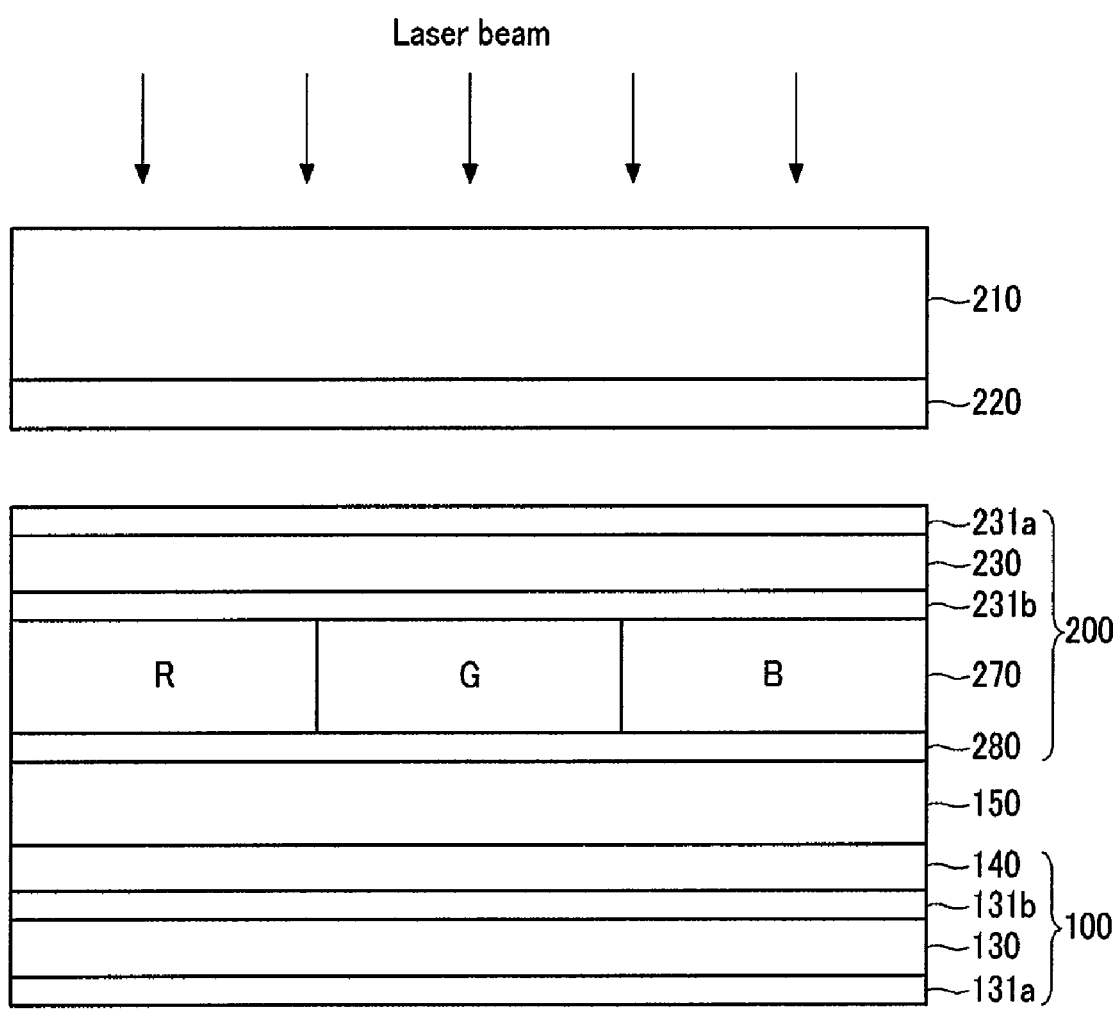
Figure 4F:
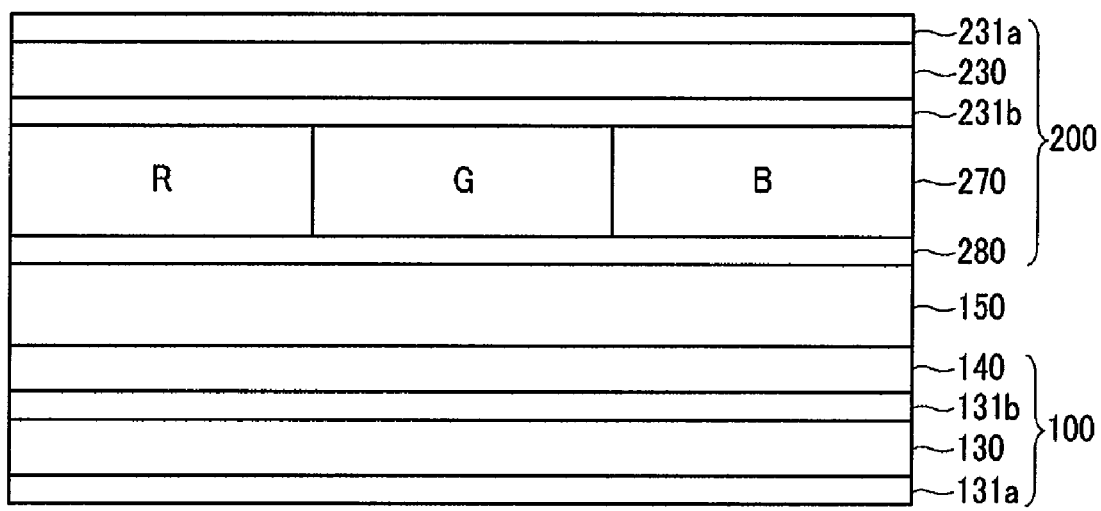

Referring to FIG. 4E and FIG. 4F, the second carrier substrate 210 and the second transparent adhesive layer 220 are separated from the color filter substrate 200 by focusing and irradiating a laser beam onto barrier layer 231a. In this manner, a flexible display device is formed in accordance with another embodiment of the present invention.

Although exemplary embodiments of the present invention have been described, it is understood that the present invention should not be limited to these exemplary embodiments. Rather, various changes and modifications can be made by one ordinarily skilled in the art within the spirit and scope of the present invention as hereinafter claimed.

What is claimed is:

1. A method of fabricating a flexible display device, comprising:
    forming a transparent adhesive layer on a carrier substrate;
    forming a barrier layer on at least one of an upper surface and a lower surface of a flexible substrate;
    laminating the barrier layer on the transparent adhesive layer;
    forming a thin film transistor array on the flexible substrate; and
    separating the carrier substrate from the flexible substrate by irradiating a laser beam onto the barrier layer.

2. The method according to claim 1, further comprising:
    forming a display layer on the thin film transistor array; and
    placing an opposite substrate on the display layer.

3. The method according to claim 2, wherein the display layer comprises at least one of a liquid crystal layer, an electrophoretic film, or a light emitting layer.

4. The method according to claim 1, wherein the laser beam is disposed a lower side of the carrier substrate, passes through the transparent adhesive layer, and is focused on a surface of the barrier layer.

5. The method according to claim 4, wherein the laser beam separates the barrier layer from the transparent adhesive layer.

6. The method according to claim 5, wherein the barrier layer comprises at least one of hydrogenated silicon nitride ("SiNx:H") and hydrogenated amorphous silicon ("a-Si:H").

7. The method according to claim 6, wherein separating the carrier substrate from the flexible substrate further comprises releasing a hydrogen molecule from the surface of the barrier layer when irradiating the laser beam.

8. The method according to claim 5, wherein the barrier layer comprises photolysis high molecule material comprising at least one of organic photo resist, urethane based resin, epoxy based resin and acryl based resin.

9. The method according to claim 8, wherein separating the carrier substrate from the flexible substrate further comprises carbonizing or decomposing a covalent bond of the surface of the barrier layer when irradiating the laser beam.

10. The method according to claim 4, wherein the transparent adhesive layer comprises a polymer adhesive comprising a series of at least one of silicone and acryl.

11. The method according to claim 10, wherein the transparent adhesive layer comprises polydimethylsiloxane.

12. The method according to claim 1, wherein the flexible substrate comprises a polymer material comprising at least one of a polyimide film, polyether sulphone, polyethylene naphthalate, polycarbonate, polyimide, polyethylene terephthalate, fiber reinforced plastic, and polyacrylate.

13. The method according to claim 1, wherein the laser beam comprises an excimer laser beam of approximately 308 nm wavelength.

14. A method of fabricating a flexible display device, comprising:
    applying a first transparent adhesive layer on a first carrier substrate;
    laminating a first flexible substrate comprising a first barrier layer on the first transparent adhesive layer;
    forming a thin film transistor array on the first flexible substrate;
    applying a second transparent adhesive layer on a second carrier substrate;
    laminating a second flexible substrate comprising a second barrier layer on the second transparent adhesive layer;
    forming a color filter array on the second flexible substrate;
    placing the first flexible substrate and the second flexible substrate facing each other, and coupling the first flexible substrate to the second flexible substrate;
    separating the first carrier substrate from the first flexible substrate by irradiating a laser beam onto the first barrier layer; and
    separating the second carrier substrate from the second flexible substrate by irradiating a laser beam onto the second barrier layer.

15. The method according to claim 14, wherein the step of placing the first flexible substrate and the second flexible substrate facing each other comprises forming a display layer between the first flexible substrate and the second flexible substrate.

16. The method according to claim 15, wherein the display layer comprises at least one of a liquid crystal layer, an electrophoretic film, and a light emit layer.

17. The method according to claim 15, the laser beam passes through the first or second transparent adhesive layer to focus on the surface of the first or second barrier layer, respectively.

18. The method according to claim 17, wherein the laser beam separates the first or second barrier layer from the first or second transparent adhesive layer, respectively.

19. The method according to claim 18, wherein the laser beam comprises an excimer laser of approximately 308 nm wavelength.

20. The method according to claim 14, wherein at least one of the first flexible substrate and the second flexible substrate comprises a polymer material comprising at least one of a polyimide film, polyether sulphone, polyethylene naphthalate, polycarbonate, polyimide, polyethylene terephthalate, fiber reinforced plastic and polyacrylate.

* * * * *